US010811084B2

(12) United States Patent
Mohammadi et al.

(10) Patent No.: US 10,811,084 B2
(45) Date of Patent: *Oct. 20, 2020

(54) SRAM ARCHITECTURE

(71) Applicant: XENERGIC AB, Lund (SE)

(72) Inventors: Babak Mohammadi, Lund (SE);
Joachim Neves Rodrigues, Lund (SE)

(73) Assignee: XENERGIC AB, Lund (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/376,462

(22) Filed: Apr. 5, 2019

(65) Prior Publication Data

US 2019/0304535 A1    Oct. 3, 2019

Related U.S. Application Data

(63) Continuation of application No. 15/760,681, filed as application No. PCT/EP2015/071372 on Sep. 17, 2015, now Pat. No. 10,304,525.

(51) Int. Cl.
| | | |
|---|---|---|
| *G11C 11/412* | (2006.01) |
| *G11C 11/419* | (2006.01) |
| *G11C 7/12* | (2006.01) |
| *G11C 8/10* | (2006.01) |
| *G11C 8/14* | (2006.01) |
| *G11C 11/418* | (2006.01) |

(52) U.S. Cl.
CPC .............. *G11C 11/412* (2013.01); *G11C 7/12* (2013.01); *G11C 8/10* (2013.01); *G11C 8/14* (2013.01); *G11C 11/418* (2013.01); *G11C 11/419* (2013.01)

(58) Field of Classification Search
CPC ............ G11C 11/412; G11C 7/12; G11C 8/10
USPC ......................................................... 365/154
See application file for complete search history.

(56) References Cited

U.S. PATENT DOCUMENTS

| | | |
|---|---|---|
| 5,040,146 A | 8/1991 | Mattausch et al. |
| 6,009,037 A | 12/1999 | Bosshart |
| 7,961,547 B2 | 6/2011 | Kanari |
| 10,304,525 B2 * | 5/2019 | Mohammadi ............ G11C 7/12 |
| 2004/0246805 A1 | 12/2004 | Nii |
| 2007/0279966 A1 | 12/2007 | Houston |
| 2010/0254199 A1 | 10/2010 | Houston |
| 2013/0064031 A1 | 3/2013 | Phan et al. |
| 2014/0269091 A1 | 9/2014 | Zheng et al. |
| 2016/0118108 A1 | 4/2016 | Yamamoto |

(Continued)

FOREIGN PATENT DOCUMENTS

| | | |
|---|---|---|
| DE | 4207937 A1 | 1/1993 |
| JP | S6018892 A | 1/1985 |
| JP | H02187991 A | 7/1990 |

(Continued)

*Primary Examiner* — Anthan Tran
(74) *Attorney, Agent, or Firm* — Dinsmore & Shohl LLP

(57) ABSTRACT

The present invention relates generally to the field of semiconductor memories and in particular to memory cells comprising a static random access memory (SRAM) bitcell (100). Leakage current in the read path is reduced by connecting a read access transistor terminal either to GND or VDD during read access or write access and idle state. The SRAM cell inverters may be asymmetrical in size. The memory may comprise various boost circuits to allow low voltage operation or application of distinguished supply voltages.

19 Claims, 10 Drawing Sheets

(56) References Cited

U.S. PATENT DOCUMENTS

2016/0225437 A1    8/2016  Kumar et al.
2018/0254081 A1*  9/2018  Mohammadi ............ G11C 8/10

FOREIGN PATENT DOCUMENTS

| JP | 2014526767 A | 10/2014 |
|----|--------------|---------|
| WO | 2015001722 A1 | 1/2015 |
| WO | 2017045720 A1 | 3/2017 |

* cited by examiner

SRAM ARCHITECTURE

CROSS REFERENCE TO RELATED APPLICATIONS

This application is a continuation of U.S. Ser. No. 15/760,681, filed Mar. 16, 2018, which is a U.S. National Phase of international patent application Serial No. PCT/EP2015/071372, filed Sep. 17, 2015, the contents of all of which are incorporated herein in their entirety.

FIELD OF THE INVENTION

The present invention relates generally to the field of electronic hardware memories and in particular to memory cells comprising a static random access memory (SRAM) bitcell.

BACKGROUND OF THE INVENTION

Performance and reliability of SRAMs in low-voltage operation pose a challenge for the engineering society. One engineering challenge of low-voltage SRAM is mainly due to analog sense-amplifiers which have a degraded performance at a scaled supply voltage. Moreover, the existing low-voltage SRAM solutions comes with a higher area cost as they require 8 transistor in the bitcell, higher design, and fabrication cost.

With the recent uprising of new devices and applications within the Internet of Things (IoT) field, the demand for ultra-low voltage design is increased. Most IoT devices would benefit from a low-voltage memory to save battery, and also from a memory with a reduced production and area cost. The International Technology Roadmap for Semiconductors (ITRS roadmap) states that revolutionary replacements of current 6T SRAM structures are challenges to be researched.

There is thus a need for a high-yield, low-voltage SRAM.

SUMMARY OF THE INVENTION

In view of the above, an objective of the invention is to solve or at least reduce one or several of the drawbacks discussed above. Generally, the above objective is achieved by the attached independent patent claims.

According to a first aspect, the present invention is realized by a memory connected to a first supply voltage, the memory comprising:
a plurality of memory cells arranged in a matrix having rows and columns;
a plurality of wordlines, each wordline, WL, comprising a row of the plurality of memory cells;
 a plurality of bitline pairs wherein each bitline pair comprising:
a column of the plurality of memory cells;
a read bitline, RBL, arranged for reading of the memory cells of the bitline pair; and
a write bitline, WBL, arranged for writing to the memory cells of the bitline pair;
each memory cell comprising a static random access memory (SRAM) bitcell comprising:
two cross-coupled inverters;
a single write access transistor arranged to supply data from the WBL comprising the memory cell to the SRAM bitcell, wherein the single write access transistor being arranged to be activated using a write word line, WWL, signal; and
a first read access transistor and a second read access transistor arranged to feed data from the SRAM bitcell, and wherein the second read access transistor being arranged to be activated using a read word line, RWL, signal, and wherein the first read access transistor arranged to translate data stored by the two cross-coupled inverters;
wherein the SRAM bitcell is connected to an inverter arranged to connect the first read access transistor to a ground during read operation of the memory cell, and to connect the first read access transistor to the first supply voltage otherwise.

By providing read transistors in the SRAM bitcell with a virtual ground, using the inverter (tail buffer) connecting the first read access transistor to the first supply voltage (VDD) when the bitcell is not involved in a read operation, the bitcell leakage will be substantially reduced. Moreover, by only using a single write access transistor, and thus a single WBL for each bitcell, the area and energy cost of the bitcell may be substantially reduced.

According to some embodiments, the two cross-coupled inverters are asymmetrical in size. This asymmetric design facilitates a write operation through the single write access transistor with low drive strength.

According to some embodiments, each WL of the plurality of wordlines being connected to a first and a second decoder,
wherein the first decoder being arranged to decode a read address and to output the RWL signal to select a WL for reading data of the SRAM bitcells comprised in the memory cells of the WL, whereby the selected WL will supply read data through to the read data access transistors of the memory cells of the selected WL; and
the second decoder being arranged to decode a write address and to output the WWL signal to select a WL for writing data to the SRAM bitcell comprised in the memory cells of the selected WL, whereby the selected WL will be supplied with data to the write access transistors of the memory cells of the selected WL.

The decoders may be any decoders according to prior art, but for decreasing the leakage current through the decoders, the first and second decoder may comprise a plurality of transistors,
wherein each transistor being connected to a select signal arranged to activate and deactivate the transistor; and
the plurality of transistors being arranged in a tree structure, wherein each branch of the tree structure comprises a single transistor, wherein the tree structure comprises at least two root branches, wherein each branch in the tree structure not being a root branch has a single parent branch, wherein each leaf branch of the tree structure is arranged to provide a RWL or WWL signal for selecting the WL for reading or writing of data from the memory,
wherein the read address or the write address are used for providing select signals for activating transistors among the plurality of transistors along a path between a root branch and a leaf branch for selecting a correct WL based on the read address or the write address respectively.

Two properties which outperform a traditional decoder are observed: the capacitive load of the decoder is substantially reduced, and the number of leakage path's experiences a tremendous reduction, e.g. reducing leakage in the address logic of the decoder by up to 200 times depending on an address space of the decoder.

According to some embodiments, the tree structure has n number of levels, wherein the plurality of transistors arranged in the tree structure are PMOS transistors, wherein each PMOS transistor comprised in a leaf branch is connected to n parallel arranged NMOS transistors connected to a ground, wherein the read address or the write address is used for providing the select signals for the n NMOS transistors such that at least one NMOS transistor at the leaf branches of the tree structure not representing the correct WL (or target WL) will be activated to discharge any voltage present at said leaf branches to the ground.

This embodiment adds an extra layer of security of selecting the correct WL based on the read or write address, since any remaining charge in the transistors, or voltage existing due to leakage, will be discharged by the NMOS transistors.

According to some embodiments, the plurality of transistors arranged in a tree structure are PMOS transistors, wherein each of the plurality of PMOS transistors is connected to a NMOS transistor connected to ground, wherein the read address or the write address are used for providing select signals for the NMOS transistors such that at least one NMOS transistor along the route of PMOS transistors to the leaf branches of the tree structure not representing the correct WL will be activated to discharge any voltage present at said leaf branches to the ground.

This embodiment adds an extra layer of security of selecting the correct WL based on the read or write address, since any remaining voltage in the transistors, or voltage existing due to leakage, will be discharged by the NMOS transistors.

According to some embodiments, the tree structure has exactly two root branches, wherein each branch in the tree structure, not being leaf branches, has two child branches, wherein a first bit in the read address or write address is used for activating one of the two root branches, wherein each subsequent bit in the read address or write address is being used for activating the transistor of one of the two child branches of the parent branch which transistor have been activated by the preceding bit in the read address or write address.

This binary tree structure facilitates a one stage decoder, since the bits of the read or write address may be used directly for activating the transistor at the left or right branch at each level of the tree structure of the decoder.

According to some embodiments, the tree structure has n≥2 number of levels, wherein the tree structure comprises >2 root branches, wherein each branch in the tree structure not being a leaf branch comprises >2 child branches; and wherein the select signals of each level of the n levels in the tree structure are controlled by a further decoder receiving a dedicated bits of the read address or write address, wherein the further decoder controlling the select signals of each level of the n levels in the tree structure is different from the first or second decoder.

Using a two stage decoder facilitates a larger address space of the decoder while keeping the number of levels of the tree structure low. In other words, pre-decoding of the select signals limits transistor stacking in the tree-decoder to e.g. 3 levels, which results in a low on-resistance in the selected transistor branch of the tree decoder, i.e. in the selected route through the decoder. This in turn reduces the voltage drop on the word select signal, RWL/WWL since a higher level of the input voltage is transmitted through the decoder.

According to some embodiments, the further decoder is a decoder as set out above. This means that the pre-decoding of the read/write address is done by a decoder implementing the above tree structure, wherein each branch in the tree structure not being a root branch has a single parent branch.

According to some embodiments, a first boost circuit is used for increasing a voltage level of the single write access transistor to a voltage level being higher than a level of the first voltage. This boosting may e.g. be performed by boosting the input voltage of the decoder decoding the write address, resulting in an increased voltage of the WWL signal. This facilitates a write operation with a single WBL from the bitcell.

According to some embodiments, a second boost circuit is used for increasing a voltage level of the second read access transistor to a voltage level being higher than a level of the first voltage. This may increase the speed of the read operation. This boosting may e.g. be performed by boosting the input voltage of the decoder decoding the read address, resulting in an increased voltage of the RWL signal.

According to some embodiment, each of the WBLs of the memory is coupled to a further boost circuit arranged to increase a voltage level of the WBL to a voltage level being higher than a level of the first voltage. This facilitates a write operation with a single WBL from the bitcell.

According to some embodiments, the further boost circuit is only boosting the voltage level of the WBL when writing a one to the bitcell. When writing a zero, the voltage on the WBL is zero.

According to some embodiment, each of the RBLs of the memory is coupled to a further boost circuit arranged to increase t a voltage level of the RBL to a voltage level being higher than a level of the first voltage. This increases the reading speed of the memory.

According to some embodiment, at least one of the first boost circuit, second boost circuit and plurality of further boost circuits comprises: at least a first and a second charge pump unit, each charge pump unit comprises four cross coupled transistors and two capacitors, each charge pump unit being fed by the supply voltage, each charge pump unit further comprising an input for receiving a first voltage and an output for delivering a second voltage being higher than the first voltage, wherein each charge pump is arranged for receiving a clock signal and a 180 degrees phase shifted version of the clock signal via the two capacitors, wherein the input of the second charge pump is connected to the output of the first charge pump through an inverter that is controlled by the clock signal.

A 180 degrees phase shifted clock signal is the same as an inverted clock signal.

The phase shift can be achieved by using an inverter.

This design of the boost circuit facilitates boosting of the first voltage to the second voltage in a single clock cycle.

According to some embodiment, the first supply voltage is a single supply voltage of the memory. By employing a single supply voltage, and using boost circuits for boosting the voltage when needed, a simplified architecture of the memory may be achieved. Moreover, using a single supply voltage which is low, e.g. 300 mV, may facilitate low-voltage operation of the memory.

However, some or all of the boost circuits may be replaced by a second supply voltage having a higher voltage than the first supply voltage. In other words, according to some embodiments, at least one of:

the single write access transistor,
the second read access transistor,
each of the writing bitlines of the memory, and
each of the reading bitlines of the memory is coupled to a second supply voltage having a higher voltage than the first supply voltage.

Other objectives, features and advantages of the present invention will appear from the following detailed disclosure, as well as from the drawings.

Generally, all terms used in the claims are to be interpreted according to their ordinary meaning in the technical field, unless explicitly defined otherwise herein. All references to "a/an/the [element, device, component, means, step, etc.]" are to be interpreted openly as referring to at least one instance of the element, device, component, means, step, etc., unless explicitly stated otherwise.

BRIEF DESCRIPTION OF THE DRAWINGS

The above, as well as additional objects, features and advantages of the present invention, will be better understood through the following illustrative and non-limiting detailed description of embodiments of the present invention, with reference to the appended drawings, where the same reference numerals will be used for similar elements, wherein.

DETAILED DESCRIPTION OF EMBODIMENTS

Figure 1:
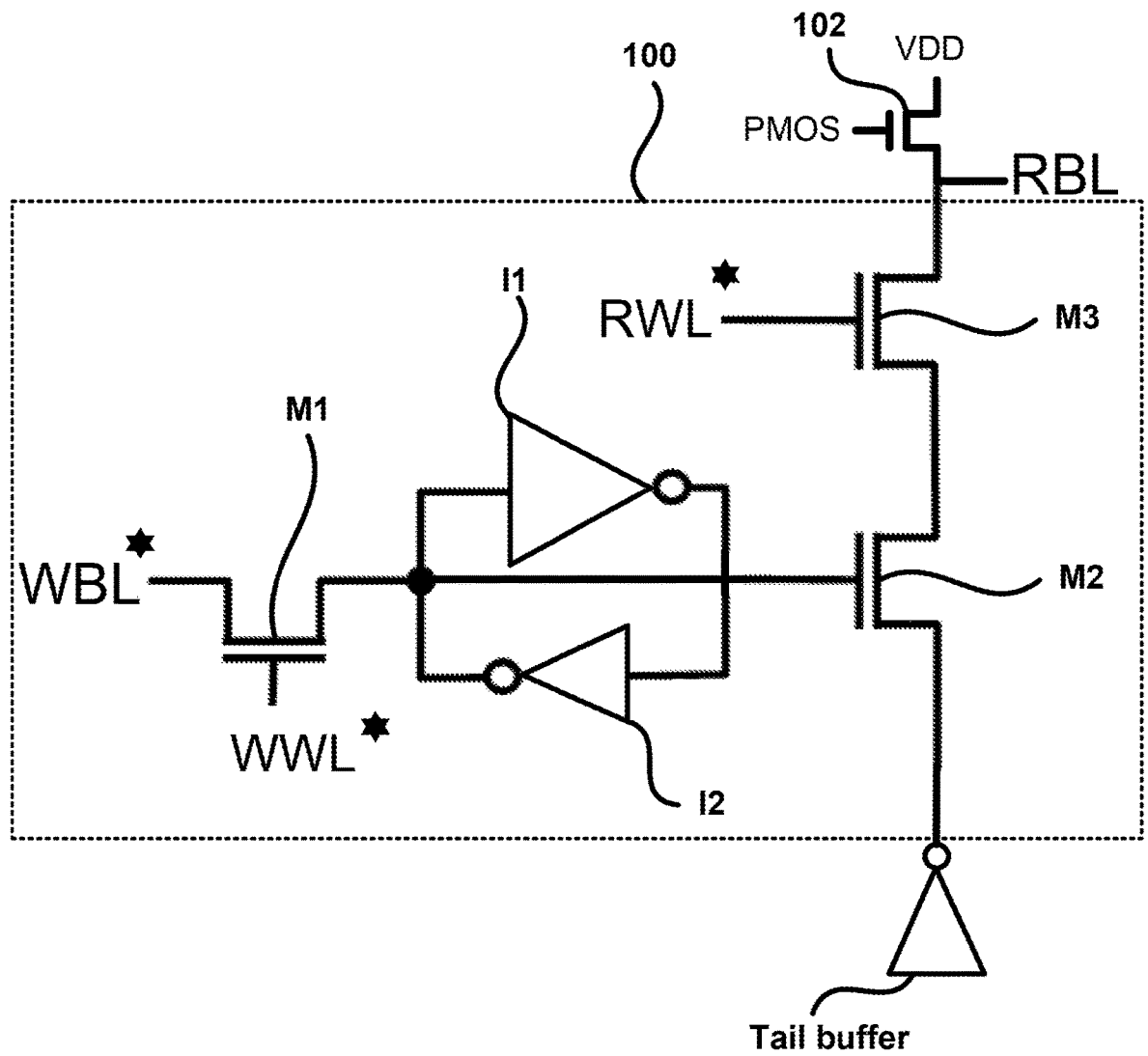
FIG. 1 shows a 7T bitcell according to embodiments of the invention.

FIG. 1 shows a 7T bitcell 100 according to embodiments of the inventions. The 7T bitcell 100 is a random access memory (SRAM) bitcell 100, which is comprised in a memory cell of a memory for digital systems. The SRAM bitcell 100 comprises two cross-coupled inverters 11, 12 and a single write access transistor M1. In this embodiment, the bitcell 100 employs two inverters 11, 12 which are asymmetric in size to ease the write procedure and reduce the leakage current through the bitcell 100. An asymmetrical design facilitates write operation of a one through the single write access transistor M1. In other embodiments, the two cross-coupled inverters 11, 12, are symmetrical in size. When writing a new value to the bitcell 100, first the single write access transistor M1 is activated, and thus conducting. This is done using a write word line signal, WWL. When the single write access transistor M1 has been activated, the new data is supplied from the writing bitline, WBL, to the SRAM bitcell 100.

It should be noted that the term conducting transistor does not encompass leakage through the transistor, but is intended to mean that the transistor is activated and in an operating mode.

The SRAM bitcell 100 further comprises a first read access transistor M2 and a second read access transistor M3. M2 and M3 are connected in series. When performing a reading operation, the second read access transistor M3 is activated using a read word line signal, RWL. The second read access transistor M3 is thus arranged to be conducting using the read word line signal, RWL. When the second read access transistor M3 is conducting, data stored by the two cross-coupled inverters 11, 12 can be translated by the first read access transistor M2, since the gate of M2 is connected to the two cross-coupled inverters 11, 12. If the bitcell 100 contains a zero, and RWL is high (RWL>0, in some embodiments, RWL=1), nothing will happen in the read bitline RBL. This means that the bitcell 100 contains a zero. But if the bitcell 100 contains a one, M2 will be activated (i.e. conducting) and if the bitcell 100 is selected by a high RWL, then RBL will be discharged through M2 and M3 and it will be known that the bitcell 100 contained a one. The reading procedure will be further described below, in conjunction with FIG. 2.

In the embodiment of FIG. 1, M1, M2 and M3 are NMOS transistors but for other applications, PMOS transistors or a combination of NMOS and PMOS transistors may be employed.

The bitcell 100 is connected to a further inverter, or Tail buffer, arranged to connect the first read access transistor M2 to a ground during read operation of the memory cell and to connect the first read access transistor M2 to the supply voltage VDD otherwise. In other words, the tail buffers create a ground connection to RBL during read, whereas during idle mode RBL is connected to the supply voltage VDD and thus pre-charging RBL together with CHG. CHG being the control signal that activates the transistor 102 to pre-charge the RBL. This may eliminate leakage on the RBL as no potential difference exists during idle mode. This embodiment may reduce the leakage current of the bitcell 100 up to 67% compared to conventional 8T bitcell with the same area footprint. Furthermore, leakage paths from the RBL are cut, guaranteeing a stable pre-charged VDD available on the RBL during slow and long read operations. It should be noted that the Tail Buffer is shared among word line bitcells such that all the bitcells in a word are connected to the same tail buffer.

The size of the bitcell 100 may be 0.261 μm² (using standard design rules), which is comparable to an 8T bitcell with pushed rules. Pushed rules may reduce the bitcell area of the bitcell 100 to 0.21 μm².

According to some embodiments, some of the transistors in the bitcell 100 are switched (turned on, conducting, etc.) using voltage boosted signals. For example, according to some embodiments, the voltage level of the single write access transistor M1 is increased by a boosted WWL signal. This is indicated in FIG. 1 by the star at the WWL signal. Alternatively, the single write access transistor is connected to a second supply voltage having a higher voltage than the first supply voltage.

According to some embodiments, each of the writing bitlines, WBLs, of the memory is coupled to a boost circuit (boost circuits will be further described below). This is indicated in FIG. 1 by the star at the writing bitline WBL. Alternatively, each of the WBLs of the memory is coupled to a second supply voltage having a higher voltage than the first supply voltage.

It should be noted that the boosting of the voltage of the WBL is only needed during a writing operation of a one to the bitcell 100. Due to voltage drop in the single write access transistor M1 (NMOS) when passing a one to be written, a voltage boost of the WBL is advantageous in order to have enough high voltage on bitcell to be able to write to the bitcell.

The above facilitate the connection of only one WBL to each bitcell 100. Traditionally, two writing bitlines are connected to each bitcell, which requires a second write access transistor. Compared to a traditional SRAM architecture the total capacitive load of the WBLs is reduced by 50%, and accordingly, dynamic power is halved. According to some embodiments, during a write operation, the bitlines/ wordlines are boosted up to 2VDD to increase the speed and reliability of write operation. The required boosted voltages are supplied using e.g. the two stage boost circuit in FIG. 8 which is capable to provide 2VDD in single clock cycle. According to other embodiments, a boost circuit comprising one or more stages may be employed, e.g. as shown in FIG. 9, and which is capable of providing n number of VDD in a s single clock cycle, wherein n corresponds to the number of stages of the boost circuit. Embodiments of the boost circuits will be further described below in conjunction with FIGS. 8-10.

According to some embodiments, for a memory with 64 WBLs, 66 such boost circuits may be used, where 64 boost circuits boost the 64 WBLs in the write operation, whereas the remaining 2 generate the boosted WWL and RWL signals. The area overhead of the boosts may be as small as 2.7% since the capacitors in the boost circuits may be implemented with metal-insulator-metal (MIM) capacitors which may be accommodated on higher metal layers of the chip.

According to some embodiments, the voltage level of the second read access transistor M3 is thus increased by a boosted RWL signal. This is indicated in FIG. 1 by the star at the RWL signal. According to other embodiments, the second read access transistor M3 is coupled to a second supply voltage having a higher voltage than the first supply voltage. By increasing the voltage level at the second read access transistor M3, driving strength of M3 increases, thus read operation is performed quicker. The RBLs of the memory may optionally also be coupled to a boost circuit or be connected to a second supply voltage having a higher voltage than the first supply voltage, such that a voltage level of the RBL is increased. This will further increase the reading speed of data from the bitcell 100.

Figure 2:
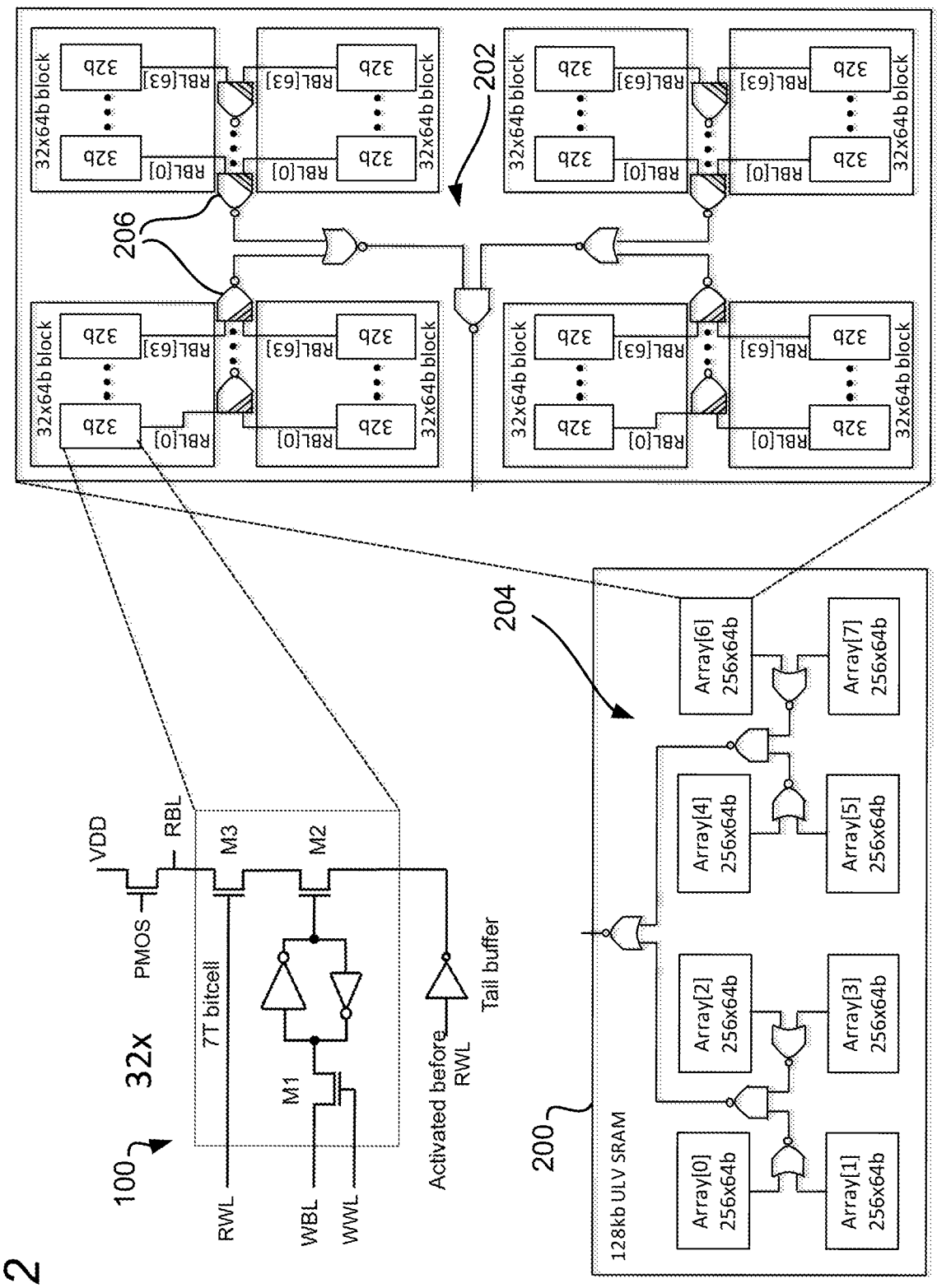
FIG. 2 shows a schematic view of a 128 kb ULV single-WELL 7T SRAM.

FIG. 2 describe the architecture of a 128 kb ULV SRAM 200. In general terms, such a memory 200 comprises a plurality of memory cells arranged in a matrix having rows and columns. The memory further comprises a plurality of wordlines, each wordline, WL, comprising a row of the plurality of memory cells, and a plurality of bitline pairs. Each bitline pair comprises a column of the plurality of memory cells, a read bitline, RBL, arranged for reading of the memory cells of the bitline pair; and a write bitline, WBL, arranged for writing to the memory cells of the bitline pair.

The memory 200 in FIG. 2 implements a read scheme which does not use sense-amplifiers. The memory 200 is compliant to logic design rules. In FIG. 2, each RBL comprises 32 bits, or in other words 32 memory cells each comprising a SRAM bitcell 100. Other numbers of bits, such as 16, 64 or 128 bits are equally possible. As described above, the Tail-Buffer eliminates the leakage path through M2-M3 and in addition to reduced static power, provides a correct read operation even at very slow clock frequencies. The tail buffer is advantageously activated one stage before the activation of M3. The read propagation delay, when reading a zero from a bitcell 100 is 0. When reading a one, the RBL is discharged through M2 and M3, whereas all the other RBLs in other RBL blocks remain at logic 1. The read-out path consists of multiple read RBLs shared by 32 words (pre-charged using CHG) for high read speed and lower dynamic power. The discharged RBL triggers a readout multiplexer and the final value propagates to output through NAND-NOR chain 202, 204 as described in FIG. 2.

According to some embodiments, the first NAND 206 in the chain may be a NAND with a large PMOS transistor for fast pull-up. This means that the first NAND 206 in the chain can be adjusted to switch already when the corresponding RBL has been discharged by a small percentage, for example 10% or 15%. This will in turn speed up the read substantially. Measurement results of this memory 200 verify 150 MHz read speed at 360 mV.

Figure 3:
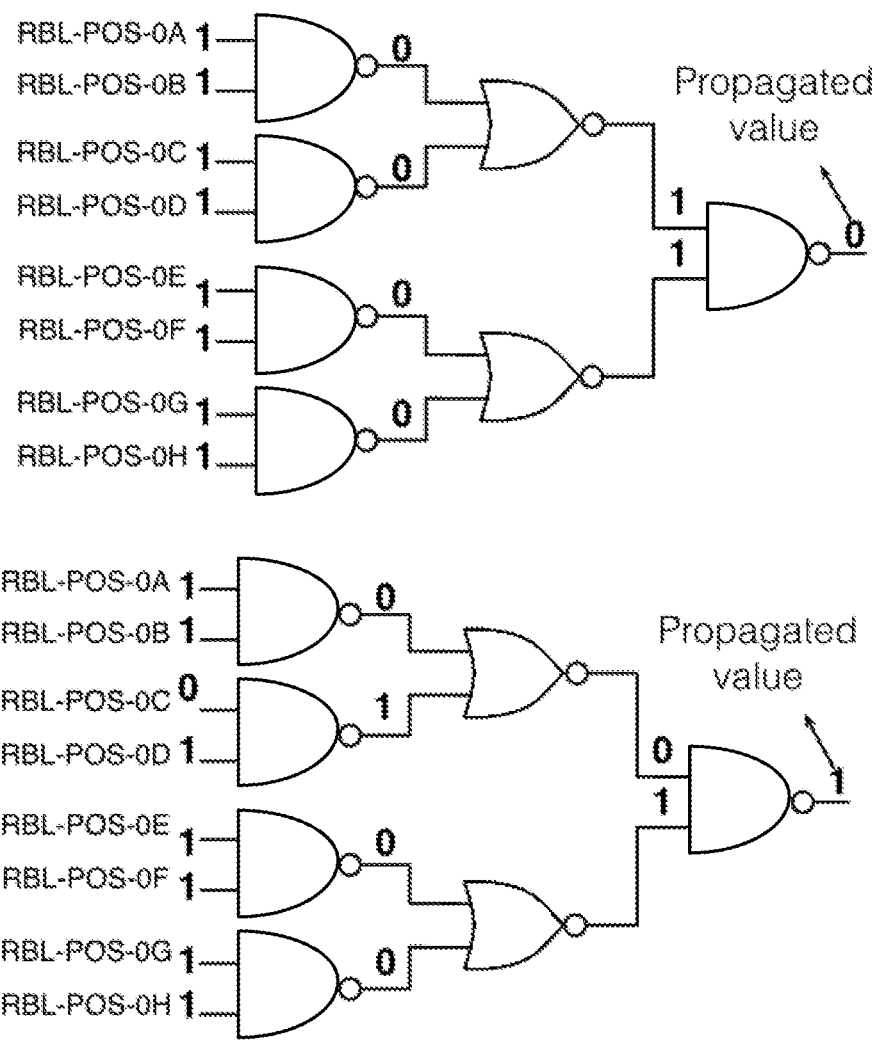
FIG. 3 shows by way of example a schematic view of a three stage NAND-NOR scheme for read operations of the memory.

FIG. 3 describe the NAND-NOR scheme for a three stage read out. Depending on the size of the memory, more or less stages are needed. For example, in FIG. 2, a six stage read out scheme is employed. In FIG. 3, the bit at RBL-Pos-0c is read out. In the top part of FIG. 3, the bit cell is not discharged, since it reads a zero as described above. This means that all RBL-positions in the RBL remain at logic one. In the three stage read out scheme of FIG. 3, this propagates through the NAND-NOR chain and ends up as a zero at the output. In the bottom part however, the bitcell is discharged and the output from the read scheme thus will be a zero.

FIGS. 4-7 describe address decoders according to embodiments of the invention. The address decoder 400, 500, 600, 700 have repetitive architectures, where its each stage gets closer to the word select signals. The repetitive architecture and independency from power wirings makes it extremely reconfigurable and tool friendly. The decoder comprises a plurality of transistors 402, 502, 602, 702 arranged on a tree structure. Each transistor is connected to a select signal, wherein the select signals is arranged to turn on and turn off (activate/deactivate, conducting/not conducting etc.) the transistor 402, 502, 602, 702 to which it is connected. In this architecture, each branch of the tree structure comprises a single transistor. Further, each branch in the tree structure not being a root branch has a single parent branch. This may reduce the leakage current with more than 5 orders of magnitude compared to a conventional decoder since the possible leakage paths through the decoder between the supply voltage (VDD) and the ground is substantially reduced.

For a memory as described herein, the decoders in FIGS. 4-7 can be employed to decode a read address and to output the RWL signal, or to decode a write address and to output the WWL signal. The read or write address is used for providing select signals for activating transistors among the plurality of transistors along a path between a root branch and a leaf branch for selecting a correct WL based on the read address or the write address respectively. Selecting the conducting path through the tree structure is made in one clock cycle as the select signal on the transistors 402, 502, 602, 702 switch the selected transistors simultaneously, making the decoder inherently glitch-free.

Figure 4:
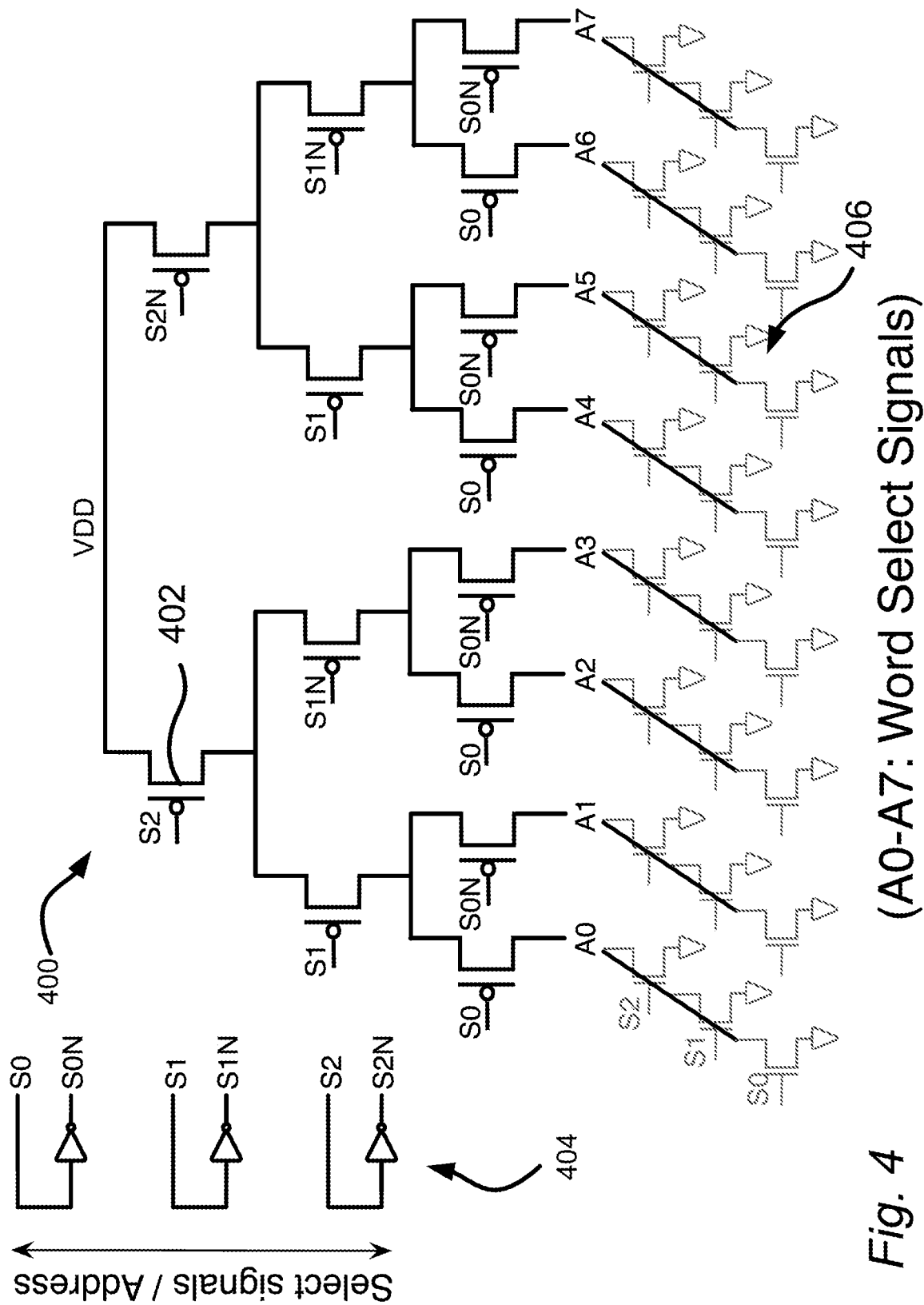
FIG. 4-7 shows four different embodiments of decoding schemes for decoding a word select signal.

The decoder 400 in FIG. 4 is a 3-8 decoder. The address space of the decoder is thus 8 bits. The decoder comprises a plurality of transistors 402 arranged on a tree structure. Each transistor is connected to a select/not select signals 404 (S0, S1, S2, S0N . . . ), these signals 404 being arranged to turn on and turn off (activate/deactivate, conducting/not conducting etc.) the transistor 402 to which it is connected. We thus have six select signals in this case, 3 select signals +3 inverted select signals, all originating from the bits of the read/write address.

In this architecture, each branch of the tree structure comprises a single transistor (in this case a PMOS transistor but as will be explained below, a NMOS transistor may equally well be used). Further, each branch in the tree structure not being a root branch has a single parent branch.

Each leaf branch of the decoder 400 is arranged to provide the RWL or WWL signal A0-A7 (depending on if the decoder is used for reading or writing in the memory) for selecting a word line for reading or writing of data from the memory. The input to the decoder is in this embodiment the supply voltage VDD. According to other embodiments, the input to the decoder is a boosted voltage received from a boost circuit. Different embodiments of possible boost circuits are described below. The boosted input voltage will result in a boosted RWL/WWL signal.

The tree structure of the decoder 400 is a binary tree structure in that the tree structure has exactly two root branches 402, wherein each branch in the tree structure, not being leaf branches, has two child branches. For this embodiment, the bits in the read address or write address can be used directly as a select signal 404, since for each level, or branch, in the tree structure, there exist only two child branches to select between. Consequently, e.g. a first bit in the read or write address with the value zero will cause the transistor of the left root branch to be activated while a bit with the value one will cause the transistor in the right root branch to be activated. In a similar way, each subsequent bit in the read address or write address may be used for activating the transistor of one of the two child branches of the parent branch which transistor have been activated by the preceding bit in the read address or write address. In this embodiment, the most significant bit (MSB) in the read or write address is used for selecting among the two root branches, while the least significant bit (LSB) is used for selecting among the two leaf branches and the bits between is used for selecting in the levels between the root level and the leaf level of the tree structure. However, the other way around may equally well be the case, i.e. the MSB is used for selection at the leaf level while the LSB is used for selecting at the root level of the tree structure.

The decoder of FIG. 4 comprises three levels of PMOS transistors 402, which results in a low on-resistance in the selected PMOS branch while at the same time the voltage leakage is reduced due to the transistor stacking. The PMOS transistor in each leaf branch is associated, or connected to, three (the same number as the number of levels in the tree structure) parallel arranged NMOS transistors 406 connected to a ground. Since, as can be seen in FIG. 4, the NMOS transistors 406 is connected to the same select signals as the PMOS transistors, i.e. the read address or the write address is used for providing the select signals for the NMOS transistors 406, at least one NMOS transistor at the leaf branches of the tree structure not representing the correct word WL will be activated such that any voltage present (due to leakage or other reasons) at said leaf branches will be discharged to the ground. In other words, the unselected leaf branches will be discharged to ground. In yet other words, these NMOSs short the unselected WWL/RWL to ground.

Figure 5:
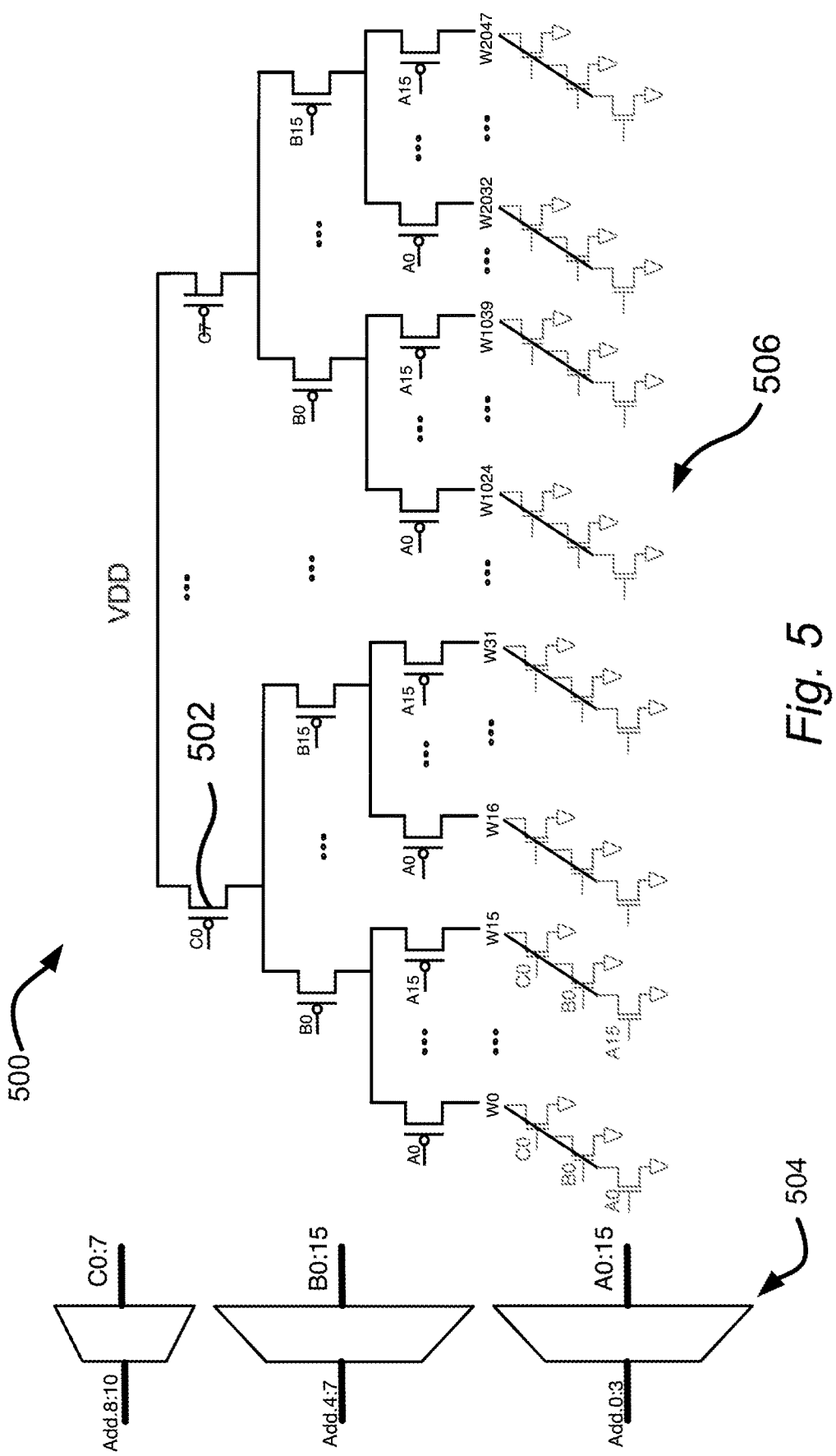

The architecture of the decoder 500 in FIG. 5 is similar to the one of FIG. 4. The decoder 500 is developed to transfer the input supply voltage VDD to the selected WWL/RWL. In some embodiments, the input voltage is a boosted voltage as will be described below. However, in the decoder of FIG. 5, the tree structure comprises 8 root branches. Moreover, each root branch, or transistor 502 in a root branch is connected to 16 child branches (transistors). Also the third level of the tree structure comprises 16 branches connected to a single parent branch. This tree structure is thus realizing an 8×16×16 decoder 500, providing a 2 k address space. In other words, the tree structure has M2 number of levels, wherein the tree structure comprises >2 root branches, wherein each branch in the tree structure not being a leaf branch comprises >2 child branches. For this reason, the decoder 500 is a two stage decoder, wherein the second stage is using the select signals 504 provided by the first stage to activate a correct route through the tree structure of PMOS transistors. The first stage comprises further decoders, where the select signals of each level of the n (three in this case) levels in the tree structure are controlled by a further decoder receiving a dedicated bits of the read address or write address. Such further decoder may be a legacy decoder known in prior art, or they may be decoders as set out herein, i.e. having a repetitive tree architecture wherein each branch in the tree structure not being a root branch has a single parent branch. A mix of such decoders may also be possible. For example, the decoder used for decoding the select signals C0:7 for the first level in the decoder 500 may be similar to the one of FIG. 4, since the decoder 400 have a 8 bit address space. The decoder for the second level, providing the select signals B0:15 for that level, may be a legacy decoder, or a decoder as the one set out in FIG. 4 but with one extra level to provide a 16 bit address space. This decoder may also be a decoder similar to the one in FIG. 5, with e.g. 4×2×2 architecture.

In the decoder 500 of FIG. 5, each leaf branch is connected to three NMOS transistor 506 arranged in parallel which are discharging the PMOS transistors of the unselected leaf branches to ground as explained above in conjunction with FIG. 4. However, this discharging effect may be achieved in different ways, for example as set out in FIG. 6 where only a part of the decoder 600 is shown. In this architecture, each of the plurality of PMOS transistors 602 is connected to a NMOS transistor connected to ground. The select signal of the NMOS transistor is the same as the select signal for the parent PMOS transistor. In this way, at least one NMOS transistor along the route of PMOS transistors to the leaf branches of the tree structure not representing the correct WL will be activated to discharge any voltage present in the transistors at the leaf branches of the tree structure to the ground.

Figure 6:
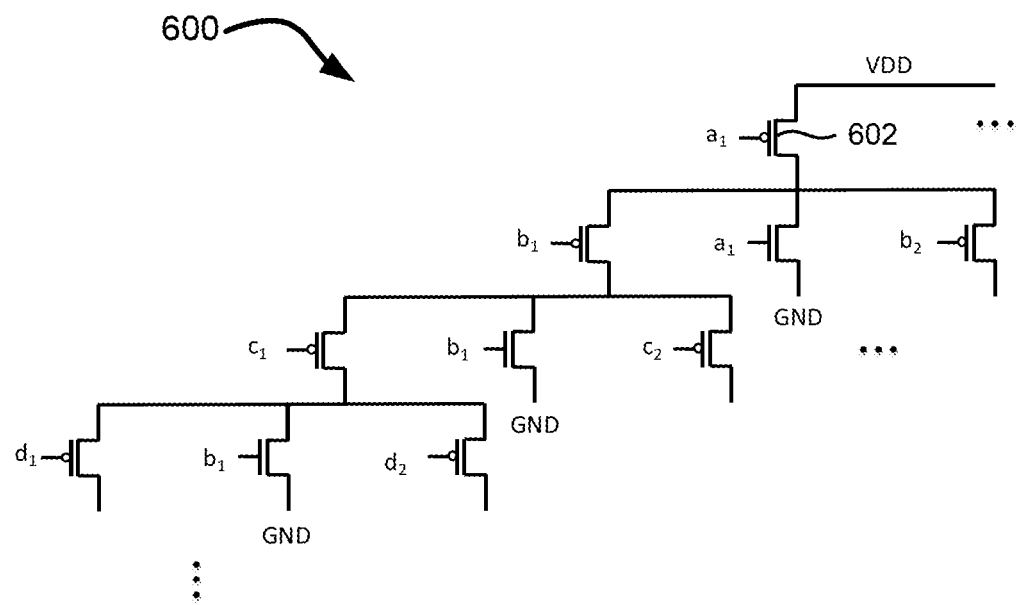
Figure 7:
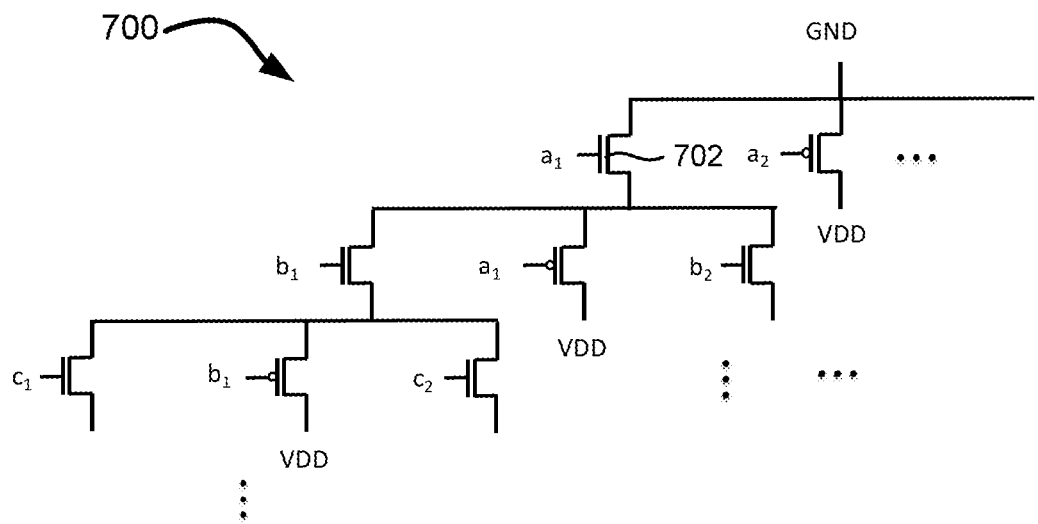

Using PMOS transistors for selecting the correct WL, as described in FIGS. 4-6, may be advantageous in that a PMOS transistor, unlike NMOS transistor, is better at passing boosted voltages. This is an advantage in low power applications, since without using boosted voltage at the input of transistor (gate of the PMOS), a boosted voltage can be passed though source-drain of PMOS transistor, since the gate of the PMOS in on mode is connected to ground. Therefore, even if the voltage of select signals is as low as 300 mV, the decoder can transfer 600 mV to WWL/RWL signals with negligible loss. Using PMOS transistors like this results in a hot WL select signal. However, in some applications, a cold output from the decoders may be desirable. In these cases, the tree structure should comprise NMOS transistors at the branches, and PMOS transistors should be used for further ensuring that the correct output from the decoder is achieved. Such architecture is shown in FIG. 7, which decoder 700 corresponds to the decoder 600 of FIG. 6. However, also the decoders 400, 500 of FIGS. 4-5 may be rearranged to provide cold output, in a similar way as described in FIG. 7.

Figure 8:
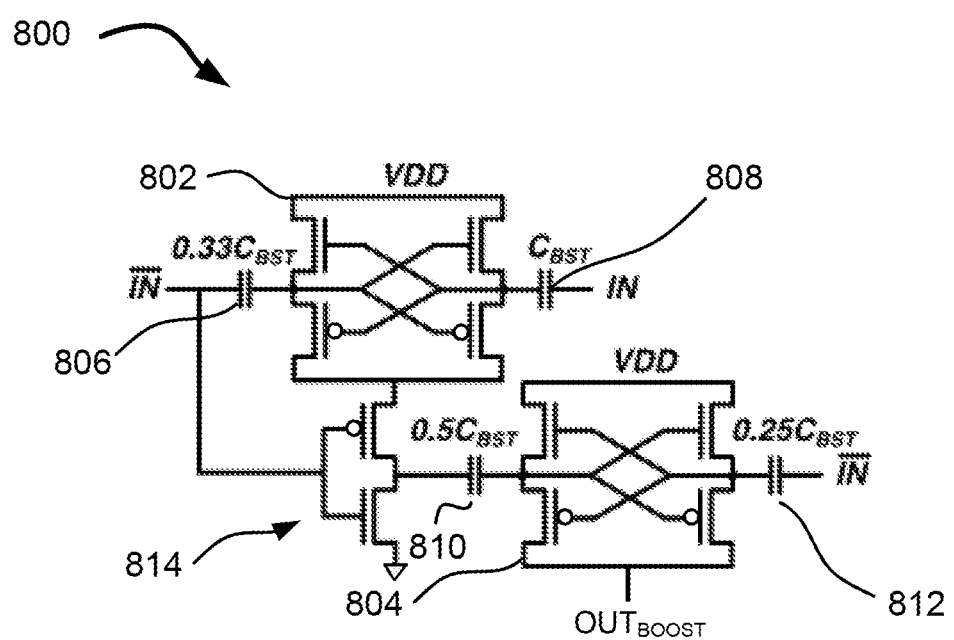
FIG. 8 shows schematic view of a two stage boost circuit capable to provide 2 VDD in single clock cycle.
Figure 9:
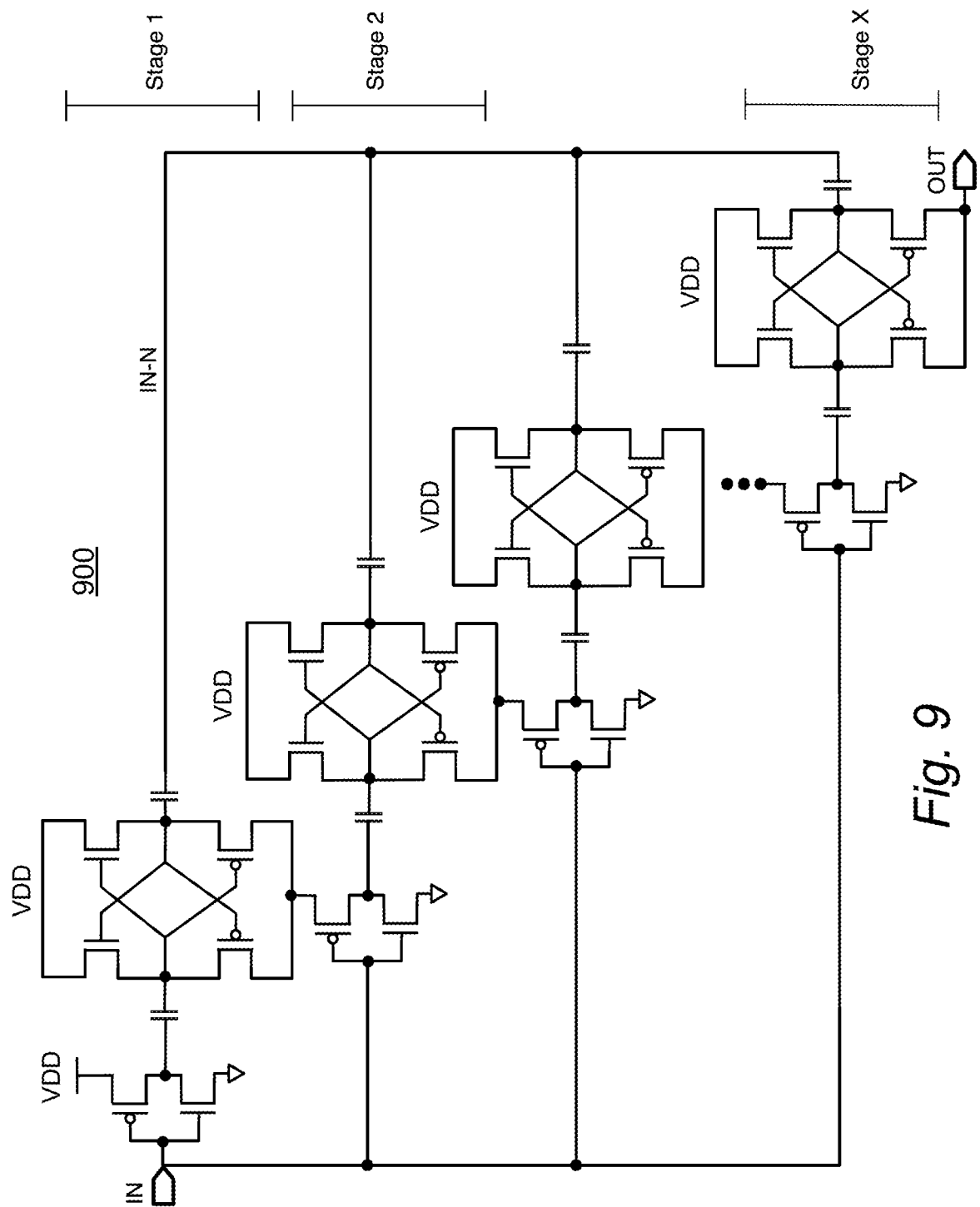
FIG. 9 shows a schematic view of a n stage boost circuit capable to provide n $V_{DD}$ in single clock cycle.

FIG. 8 describe a boost circuit 800, where the cross-connected stages 802, 804 is similar to the charge pump (CP) in Ming-Dou Ker et al., "Design of charge pump circuit with consideration of gate-oxide reliability in low-voltage CMOS processes," IEEE J. Solid-State Circuits, vol. 41, no. 5, pp. 1100-1107, May 200. However, unlike the charge pump developed by Ming-Dou or other available CP architectures, the current boost unit 800 provides 2×VDD in a single clock cycle. The boost unit 400 comprises a first 802 and a second 804 CP unit. Each CP unit 802, 804 comprise four cross coupled transistors and two capacitors. Each CP unit also comprises an input and an output. The four cross coupled transistors in each CP unit comprises 2 NMOS transistors connected to a supply voltage VDD, and two PMOS transistors connected to the NMOS transistors and to the output of the CP unit. Each charge pump unit is arranged for receiving a clock signal IN and a 180 degrees phase shifted version IN of the clock signal via the two capacitors. As described above, each CP unit is being fed by a supply voltage VDD (or first voltage), via the NMOS transistors. The output of each CP unit 802, 804 will be delivering a second voltage being higher than the first voltage, due to the coupling between the NMOS transistors, PMOS transistors and the capacitors 806-812 of each charge pump. The CP units 802, 804 are connected in parallel, which means that the input of the second charge pump is connected to the output of the first charge pump through an inverter 814 that is controlled by the clock signal.

This design facilitate an output of 2 VDD ($OUT_{BOOST}$) in a single clock cycle. In the context of the memory for digital systems described herein, this means that a processor connected to the memory need not to wait more than necessary for a read/write operation, since the boosting of the voltage used for read/write can be performed in a single clock cycle.

The capacitors 806-812 of the boost circuit 800 may have different capacitance sizes (as in FIG. 8) to reduce the cost of the design, or the capacitors may be equally sized. In IC design and chip industry, the cost of a capacitor depends on the size of the capacitor. Therefore it may be advantageously to reduce the capacitance of a capacitor when possible, to reduce the cost of the boost circuit 800. The capacitors providing the charge for output load may be advantageously larger, while the other capacitors may have less capacitance. In the boost circuit 800, the capacitor 808 connected to the first CP unit 802, which is providing the charge for output load, has full capacitance $C_{BST}$. The actual capacitance value depends on the application wherein the boost circuit should be used. For example, $C_{BST}$ in may be chosen with respect to the capacitive load on a write bitline, WBL, signal which voltage should be boosted.

The other capacitors 806, 810, 812 may then have lower capacitance, to reduce cost. The capacitor 810 connected to the output of the first CP unit 802 may have a larger capacitance, since it receives a boosted (higher) voltage.

The boost circuit in FIG. 8 is a two stage circuit which delivers 2VDD. However, the architecture of the boost circuit may be expanded to comprise any number of stages, depending on the application. FIG. 9 shows a boost circuit 900 wherein X number of stages is employed. The output OUT of such boost circuit is thus X times VDD. Except for the increased number of stages, the boost circuit 900 of FIG. 9 is similar to the boost circuit 800 of FIG. 800.

Figure 10:
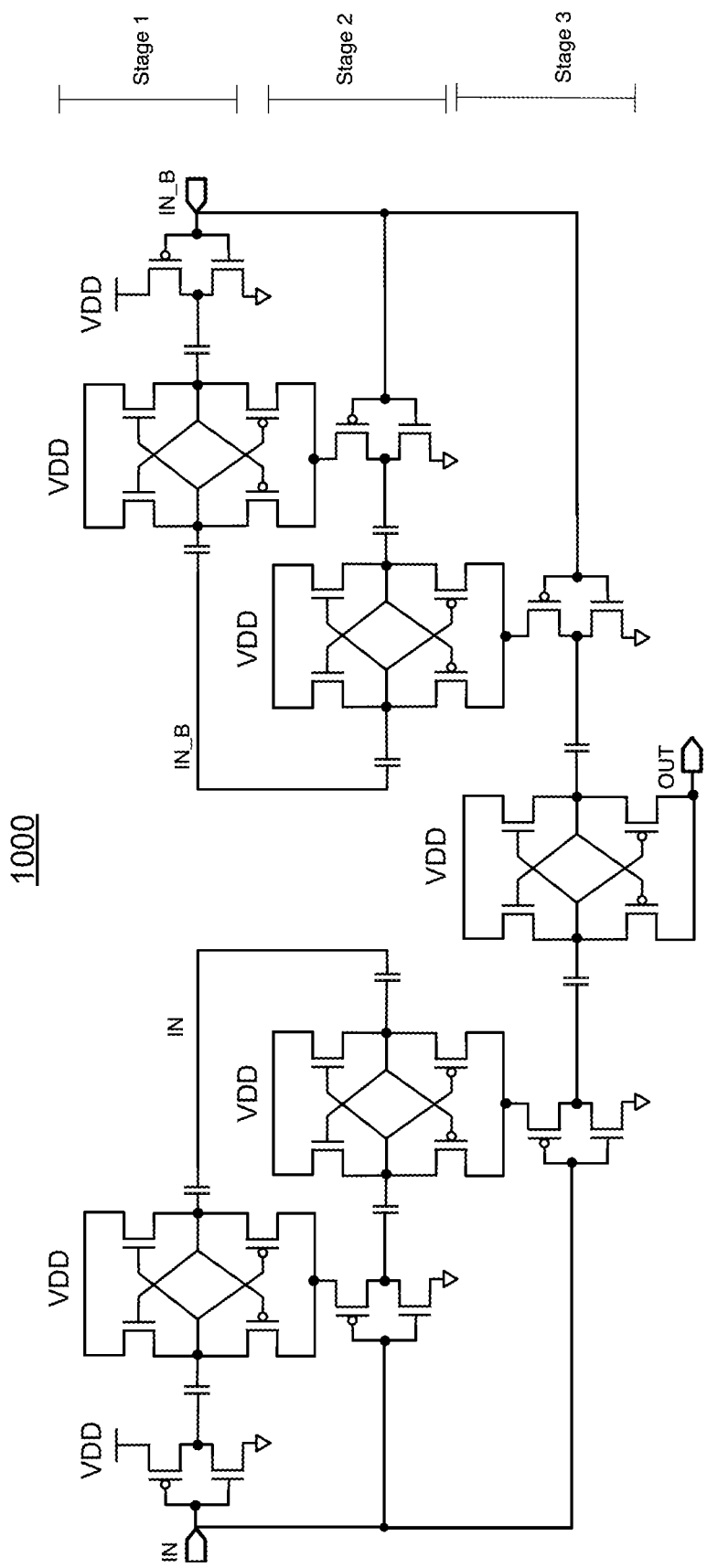
FIG. 10 shows a schematic view of a 3 stage boost circuit for DC-DC convertion.

The inventive architecture of the boost circuit explained above may also be used for a DC-DC converter. Such a boost circuit 1000 is shown in FIG. 10. The boost circuit in FIG. 10 comprises three stages, but any number of stages such as 2, 4, 5 or 10 may equally well be used.

Figure 11:
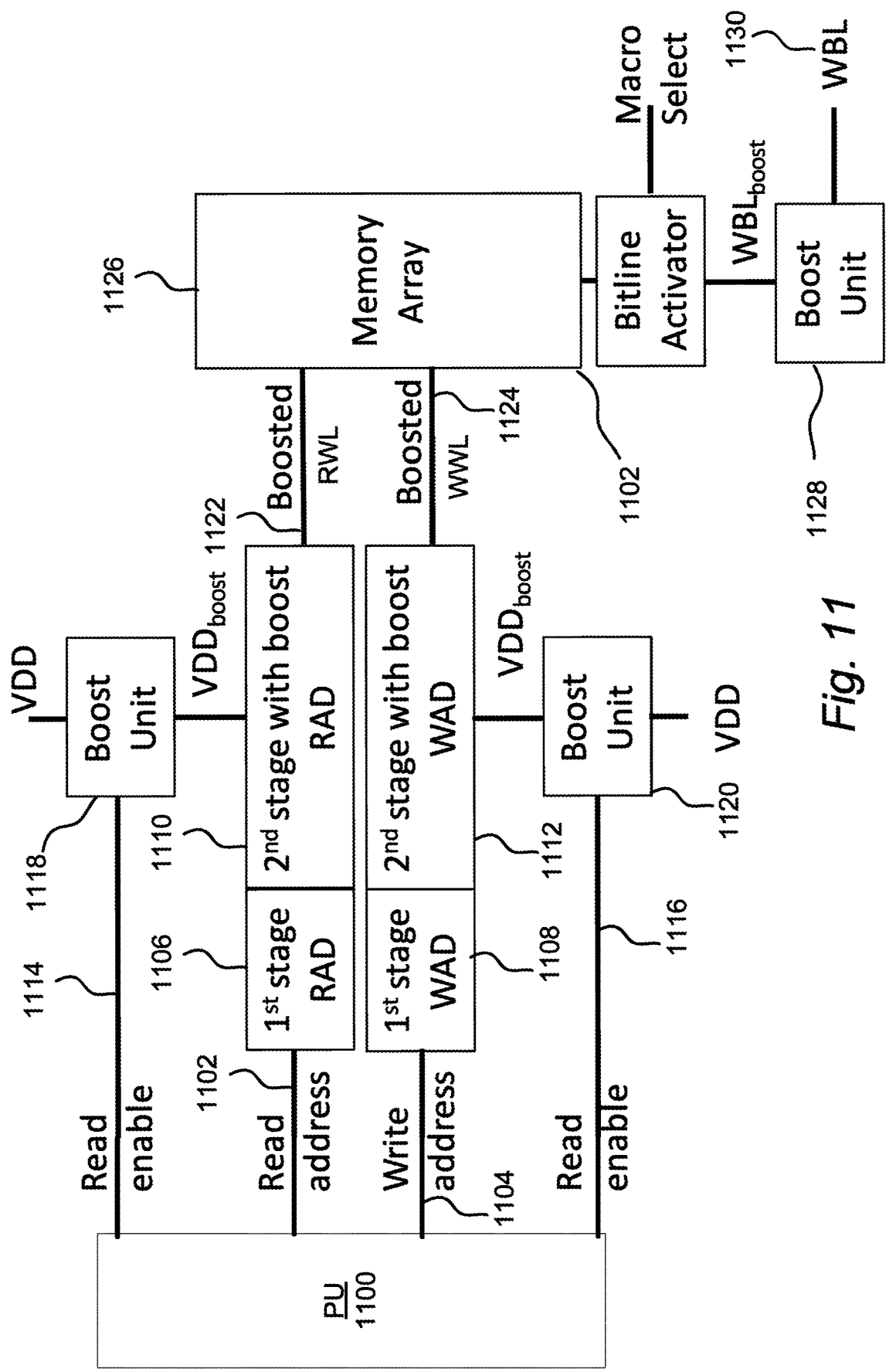
FIG. 11 shows a box diagram of the connection between different parts of a chip comprising a ULV SRAM.

FIG. 11 shows by way of example an architecture for a memory connected to a processor unit, PU, 1100 for a digital system, for example a memory embedded in an integrated circuit. The PU 1100 provides signals such as read address 1102, write address 1104 to the memory. The read 1102 and write 1104 address are fed to a two stage decoder, for example a decoder as explained in conjunction with FIG. 5 above. 1$^{st}$ stage WAD/RAD 1106, 1108 denotes the first stage of the decoder, which provides select signals to the transistors in the tree structure of the decoder. The processor 1100 further provides read/write enable signals 1114, 1116 which enables boost units 1118, 1120 to provide a boosted VDD to the root branches of the second stage 1110, 1112 of the decoders. The boost units 1118, 1120 may for example be as described in conjunction with FIGS. 8-9. By boosting the input voltage of the second stage of the decoders 1110, 1112, a voltage boosted RWL, WWL signals 1122, 1124 is achieved. This result in a higher read/write speed, and the boosted WWL signal 1124 also facilitate the single write access transistor design of the bitcell as described above in conjunction with FIG. 1. It should be noted that according to some embodiments, the input voltage to the second stage 1110 of the decoder for decoding the RWL signal is not boosted which thus result in that the RWL signal is not boosted either. It should also be noted that according to some embodiments, the voltage input to the second stage 1110, 1112 of the decoders is the result of a second supply voltage having a higher voltage than the first supply voltage VDD, e.g. the second supply voltage may be 2 VDD.

The boosted RWL/WWL 1122, 1124 is received by the memory array 1126. The memory array comprises a plurality of memory cells arranged in a matrix having rows and columns. The memory array 1126 further comprises a plurality of wordlines, each wordline, WL, comprising a row of the plurality of memory cells. The memory array further comprises a plurality of bitline pairs, wherein each bitline pair comprising: a column of the plurality of memory cells; a read bitline, RBL, arranged for reading of the memory cells of the bitline pair; and a write bitline, WBL, arranged for writing to the memory cells of the bitline pair. Each memory cell in the memory array comprises a static random access memory (SRAM) bitcell as described in conjunction with FIG. 1 above.

In FIG. 11, only a single write bitline WBL 1130 is shown, the read bitline RBL have been omitted for ease of description. The WBL is of the memory is coupled to a further boost circuit 1128, such that a voltage level of the WBL is increased. This will increase the writing speed of the memory. According to some embodiments, the WBL 1130 is instead coupled to a second supply voltage having a higher voltage than the first supply voltage.

The above may enable a write operation of the memory with a single write BL (WBL) since the WWL and WBL is boosted to 2×VDD during the write operation.

In summary, the disclosed embodiments relates generally to the field of electronic hardware memories and in particular to a low-voltage SRAM.

The invention claimed is:
1. A memory connected to a supply voltage, the memory comprising:
    a plurality of memory cells arranged in a matrix having rows and columns;
    a plurality of wordlines, each wordline connected to a row of the plurality of memory cells;
    a plurality of bitline pairs, each bitline pair comprising:
    a column of the plurality of memory cells;
    a first bitline arranged for reading or writing the memory cells of the bitline pair; and
    a second bitline arranged for reading or writing the memory cells of the bitline pair;

each memory cell comprising a static random access memory bitcell comprising:
two cross-coupled inverters;
a first access transistor connected to the first bitline, the first access transistor being arranged to be activated using a first word line signal; and
a second access transistor connected to the second bitline, the second access transistor arranged to be activated using a second word line signal;
the memory further comprising one or more boost circuits comprising:
at least a first and a second charge pump unit, each charge pump unit comprising four cross coupled transistors and two capacitors, each charge pump unit being fed by a supply voltage, each charge pump unit comprising an input for receiving a first voltage and an output for delivering a second voltage being higher than the first voltage, wherein each charge pump unit is arranged for receiving a clock signal or a control signal and a phase shifted version of the clock signal or control signal via the two capacitors, wherein the input of the second charge pump is connected to the output of the first charge pump through an inverter or a PMOS-NMOS pair controlled by the clock signal or control signal.

2. The memory of claim 1, wherein the supply voltage is the first voltage.

3. The memory of claim 1, wherein the boost circuit is configured to provide a second voltage of the second charge pump that is at least two times the first voltage of the first charge pump in a single clock cycle.

4. The memory of claim 1, wherein the phase shifted version of the clock signal is 180 degrees phase shifted.

5. The memory of claim 1, wherein the first and second charge pumps are connected in parallel.

6. The memory of claim 1, wherein the one or more boost circuits is/are selected from a first boost circuit for increasing a voltage level of the first access transistor to a voltage level being higher than a level of the first voltage, a second boost circuit for increasing a voltage level of the second access transistor to a voltage level being higher than a level of the first voltage, further boost circuits arranged to increase voltage levels of the first bitline or the second bitline to a voltage higher than a level of the first voltage.

7. The memory of claim 1, further comprising a third charge pump unit comprising four cross coupled transistors and two capacitors, the third charge pump unit being fed by the supply voltage, the third charge pump unit further comprising an input for receiving a first voltage and an output for delivering a second voltage being higher than the first voltage, the third charge pump unit being arranged for receiving the clock signal and the phase shifted version of the clock signal via the two capacitors, wherein the input of the third charge pump is connected to the output of the second charge pump through an additional inverter or PMOS-NMOS pair controlled by the clock signal.

8. The memory of claim 7, wherein the boost circuit is configured to provide a second voltage of the third charge pump that is at least three times the first voltage of the first charge pump in a single clock cycle.

9. The memory of claim 1, comprising X charge pump units comprising four cross coupled transistors and two capacitors, each charge pump unit being fed by the supply voltage, each charge pump unit further comprising an input for receiving a first voltage and an output for delivering a second voltage being higher than the first voltage, each charge pump unit being arranged for receiving the clock signal or control signal and the phase shifted version of the clock signal or control signal via the two capacitors, wherein the input of the X:th charge pump is connected to the output of the (X−1):th charge pump through an inverter or PMOS-NMOS pair controlled by the clock signal or control signal, wherein X is an integer greater than 3.

10. The memory of claim 9, wherein the boost circuit is configured to provide a second voltage of the X:th charge pump that is at least X times the first voltage of the first charge pump in a single clock cycle.

11. A boost circuits comprising:
at least a first and a second charge pump unit, each charge pump unit comprising four cross coupled transistors and two capacitors, each charge pump unit being fed by a supply voltage, each charge pump unit comprising an input for receiving a first voltage and an output for delivering a second voltage being higher than the first voltage, wherein each charge pump unit is arranged for receiving a clock signal or control signal and a phase shifted version of the clock signal or control signal via the two capacitors, wherein the input of the second charge pump is connected to the output of the first charge pump through an inverter or a PMOS-NMOS pair controlled by the clock signal or control signal.

12. The boost circuit of claim 11, wherein the supply voltage is the first voltage.

13. The boost circuit of claim 11, wherein the boost circuit is configured to provide a second voltage of the second charge pump that is at least two times the first voltage of the first charge pump in a single clock cycle.

14. The boost circuit of claim 11, wherein the phase shifted version of the clock signal is 180 degrees phase shifted.

15. The boost circuit of claim 11, wherein the first and second charge pumps are at least partly connected in parallel.

16. The boost circuit of claim 11, further comprising a third charge pump unit comprising four cross coupled transistors and two capacitors, the third charge pump unit being fed by the supply voltage, the third charge pump unit further comprising an input for receiving a first voltage and an output for delivering a second voltage being higher than the first voltage, the third charge pump unit being arranged for receiving the clock signal or control signal and the phase shifted version of the clock signal or control signal via the two capacitors, wherein the input of the third charge pump is connected to the output of the second charge pump through an additional inverter controlled by the clock signal or control signal.

17. The boost circuit of claim 16, wherein the boost circuit is configured to provide a second voltage of the third charge pump that is at least three times the first voltage of the first charge pump in a single clock cycle.

18. The boost circuit of claim 11, comprising X charge pump units comprising four cross coupled transistors and two capacitors, each charge pump unit being fed by the supply voltage, each charge pump unit further comprising an input for receiving a first voltage and an output for delivering a second voltage being higher than the first voltage, each charge pump unit being arranged for receiving the clock signal or control signal and the phase shifted version of the clock signal or control signal via the two capacitors, wherein the input of the X:th charge pump is connected to the output of the (X−1):th charge pump through an inverter controlled by the clock signal or control signal, wherein X is an integer greater than 3.

19. The boost circuit of claim 18, wherein the boost circuit is configured to provide a second voltage of the X:th charge pump that is at least X times the first voltage of the first charge pump in a single clock cycle.

* * * * *